(12) United States Patent
Sawigun (10) Patent No.: US 12,468,327 B2
(45) Date of Patent: Nov. 11, 2025

(54) VOLTAGE REFERENCE CIRCUIT AND A POWER MANAGEMENT UNIT

(71) Applicant: IMEC VZW, Leuven (BE)

(72) Inventor: Chutham Sawigun, Leuven (BE)

(73) Assignee: IMEC VZW, Leuven (BE)

( * ) Notice: Subject to any disclaimer, the term of this patent is extended or adjusted under 35 U.S.C. 154(b) by 237 days.

(21) Appl. No.: 18/126,665

(22) Filed: Mar. 27, 2023

(65) Prior Publication Data

US 2023/0315137 A1 Oct. 5, 2023

(30) Foreign Application Priority Data

Mar. 29, 2022 (EP) ..................... 22165066

(51) Int. Cl.
*G05F 3/16* (2006.01)

(52) U.S. Cl.
CPC ..................... *G05F 3/16* (2013.01)

(58) Field of Classification Search
CPC ........................................ G05F 3/16
See application file for complete search history.

(56) References Cited

U.S. PATENT DOCUMENTS

| | | | |
|---|---|---|---|
| 7,795,856 B2 | 9/2010 | Aota | |
| 7,843,253 B2 | 11/2010 | Aota et al. | |
| 2003/0052661 A1* | 3/2003 | Tachimori | G05F 3/242 |
| | | | 323/313 |
| 2003/0146785 A1* | 8/2003 | Ueda | G05F 3/24 |
| | | | 327/543 |
| 2007/0057291 A1 | 3/2007 | Aota | |
| 2008/0018386 A1 | 1/2008 | Hitomi et al. | |
| 2014/0266140 A1* | 9/2014 | Iriarte | G05F 3/242 |
| | | | 323/313 |
| 2016/0111295 A1* | 4/2016 | Shih | H10D 84/0144 |
| | | | 438/703 |
| 2020/0136606 A1 | 4/2020 | Watanabe et al. | |

OTHER PUBLICATIONS

Seok et al: "A Portable 2-Transistor Picowatt Temperature-Compensated Voltage Reference Operating at 0.5 V", IEEE Journal of Solid-State Circuits, vol. 47, No. 10, 2012, pp. 2534-2545.
Bai et al: "A Simple Voltage Reference with Ultra Supply Independency", 2012 IEEE International Symposium on Circuits and Systems, Seoul, Korea, 2012, pp. 2829-2832.

(Continued)

*Primary Examiner* — Harry R Behm
(74) *Attorney, Agent, or Firm* — MOSER TABOADA (57) ABSTRACT

A voltage reference circuit comprises: a first transistor; a second transistor, wherein the first transistor and the second transistor are arranged in a stacked connection between a terminal connected to ground and a terminal connected to a supply voltage, wherein a reference voltage is output at an output node between the first transistor and the second transistor; and a regulating transistor, wherein the regulating transistor is connected between the supply voltage and the first transistor in a stacked connection with the second transistor, wherein a bulk terminal of the regulating transistor is connected to the output node for compensating changes in the reference voltage at the output node to maintain a stable reference voltage level.

12 Claims, 8 Drawing Sheets

(56) References Cited

OTHER PUBLICATIONS

Wang et al: "A 420 fW Self-Regulated 3T Voltage Reference Generator Achieving 0.47%/V Line Regulation from 0.4-to-1.2 V", 43$^{rd}$ IEEE European Solid State Circuits Conference, Leuven, Belgium, 2017, pp. 15-18.

Lin et al: "A 1-nW Ultra-Low Voltage Subthreshold CMOS Voltage Reference With 0.0154%/V Line Sensitivity", IEEE Transactions on Circuits and Systems—II: Express Briefs, vol. 66, No. 10, 2019, pp. 1653-1657.

Bialek et al: "A 6-Transistor Ultra-Low Power CMOS Voltage Reference with 0.02%/V Line Sensitivity", 2020 IEEE Custom Integrated Circuits Conference, Boston, USA, 2020, pp. 1-4.

Ji et al: "18.8 A 192pW Hybrid Bandgap-Vin Reference with Process Dependence Compensated by a Dimension-Induced Side-Effect", 2019 IEEE International Solid-State Circuits Conference, 2019, pp. 308-310.

Ji et al: "A 192 pW Voltage Reference Generating Bandgap-$V_{th}$ With Process and Temperature Dependence Compensation", IEEE Journal of Solid-State Circuits, vol. 54, No. 12, 2019, pp. 3281-3291.

Extended European Search Report in EP22165066.6 dated Sep. 22, 2022.

\* cited by examiner (Prior art) Fig. 1

VOLTAGE REFERENCE CIRCUIT AND A POWER MANAGEMENT UNIT

TECHNICAL FIELD

The present description relates to a voltage reference circuit which is configured to generate a reference voltage. The present description further relates to a power management unit comprising the voltage reference circuit.

BACKGROUND

Voltage reference circuits are used for providing a reliable reference voltage, which may further be used to control electronic circuits. For instance, a power management unit typically uses a voltage reference circuit in order to provide a reliable reference voltage, which can be used to generate direct current (DC) voltages and currents for biasing or supplying to an electronic circuit.

The reference voltage output by the voltage reference circuit should provide a stable voltage level which is not affected or minimally affected by parameter variations, such as temperature variations or variations in supply voltage to the reference voltage circuit.

In addition, the voltage reference circuit should be able to consume very small power levels. In particular, the voltage reference circuit may be used in small devices, such as Internet of Things (IoT) devices that may be almost exclusively in a sleep mode and only awake for brief moments of time. Thus, power consumption of such devices is mainly based on the power consumed during sleep mode. The voltage reference circuit may however be always-on and therefore the power consumption of the voltage reference circuit may be of huge importance.

Further, a compact architecture of the voltage reference circuit is advantageous in ensuring that the voltage reference circuit requires only a small area when being arranged in small devices. Also, a compact architecture may contribute to the voltage reference circuit consuming small power levels.

Figure 1:
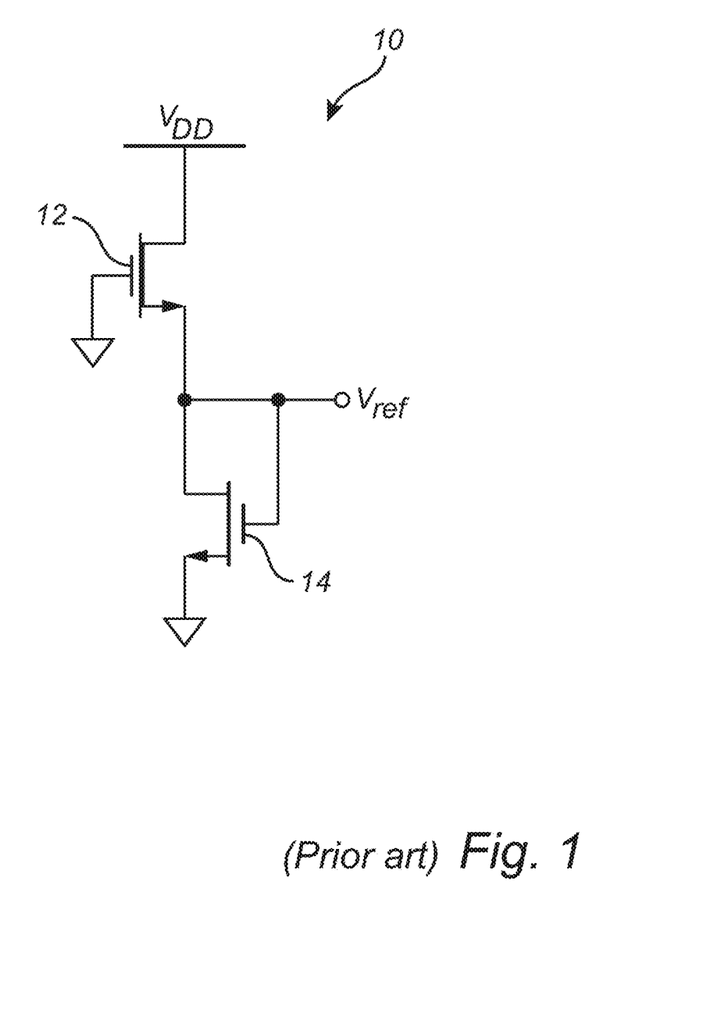
FIG. 1 is a schematic view of a voltage reference circuit according to prior art.

FIG. 1 illustrates a known two-transistor (2T) voltage reference circuit 10. In the 2T voltage reference circuit, a zero threshold or native n-type metal-oxide-semiconductor (nMOS) transistor 12 is arranged with a gate terminal connected to ground and on top of a thick oxide nMOS transistor 14. This provides a very compact voltage reference circuit. However, the 2T voltage reference circuit may be susceptible to variations in supply voltage such that the output reference voltage may vary based on variations in supply voltage.

In Bai et al: "A Simple Voltage Reference with Ultra Supply Independency", 2012 IEEE International Symposium on Circuits and Systems (ISCAS), Seoul, 2012, pp. 2829-2832, a voltage reference circuit is described for providing an improved insensitivity to supply voltage. However, the voltage reference circuit uses several additional transistors increasing complexity and power consumption of the voltage reference circuit.

The native nMOS transistor as used in the 2T voltage reference circuit can be formed without specially grown oxide, using only a natural thin oxide film that may be formed over silicon during processing of other layers when manufacturing transistors. However, native nMOS transistors may not be available in all transistor manufacturing technologies. For instance, when using fully-depleted silicon-on-insulator (FDSOI) technology, only native p-type metal-oxide-semiconductor (pMOS) transistors may be available. Further, pMOS and nMOS transistors may not be available on a common substrate, such that the 2T voltage reference circuit shown in FIG. 1 may not be available in such technology.

SUMMARY

An objective of the present description is to provide a voltage reference circuit with a compact area and low power consumption, while providing an insensitivity to parameter variations, such as variations in supply voltage and/or temperature. A further objective is to provide a voltage reference circuit which does not require use of native nMOS transistors.

These and other objectives are at least partly met by the invention as defined in the independent claims. Preferred embodiments are set out in the dependent claims.

According to a first aspect, there is provided a voltage reference circuit comprising: a first transistor comprising a gate terminal, a source terminal, a drain terminal and a bulk terminal; a second transistor comprising a gate terminal, a source terminal, a drain terminal and a bulk terminal, wherein the first transistor and the second transistor are arranged in a stacked connection between a terminal connected to ground and a terminal connected to a supply voltage, wherein a reference voltage is output at an output node between the first transistor and the second transistor; a regulating transistor comprising a gate terminal, a source terminal, a drain terminal and a bulk terminal, wherein the regulating transistor is connected between the supply voltage and the first transistor in a stacked connection with the second transistor, wherein the bulk terminal of the regulating transistor is connected to the output node for compensating changes in the reference voltage at the output node to maintain a stable reference voltage level.

According to the first aspect, a regulating transistor is added to a voltage reference circuit having a first transistor and a second transistor. Hence, the voltage reference circuit may use only three transistors for providing a stable reference voltage level such that the voltage reference circuit may be very compact and may also consume ultra-low power.

The regulating transistor is configured with the bulk terminal connected to the output node such that the reference voltage is provided as feedback to the regulating transistor. This implies that any change in the reference voltage affects the bulk terminal of the regulating transistor such that the reference voltage can be maintained at a stable, unchanged reference voltage level.

The voltage reference circuit is able to provide a reference voltage level which has a high insensitivity to parameter variations. The voltage reference circuit can provide a high line regulation, such that the voltage reference circuit provides a stable reference voltage level (small change in output reference voltage) over a large range of supply voltage values. The voltage reference circuit can further provide good temperature characteristics, such that a low temperature coefficient (variation of the output reference voltage as a function of temperature) is provided.

The voltage reference circuit may be implemented using same type of transistors for the first transistor, the second transistor and the regulating transistor. In particular, the voltage reference circuit need not use any native transistor. This facilitates use of the voltage reference circuit in technologies for which native nMOS transistors are not readily available. On the other hand, the regulating transistor is configured with the bulk terminal connected to the output node such that a bulk terminal should be available. Thus, implementation of the voltage reference circuit in, for instance, FDSOI technology is possible.

It should be realized that although conventional complementary metal-oxide-semiconductor (CMOS) technology may not provide a bulk terminal providing an extra gate terminal for individually controlling transistors, the voltage reference circuit may be implemented in CMOS technology. For instance, the second transistor and the regulating transistor may be implemented as nMOS transistors associated with deep n-wells for providing bulk terminals of the nMOS transistors.

The definition that transistors are arranged in a stacked connection should be understood such that the transistors are connected in series for providing a common direction of current through the transistors in the voltage reference circuit. Thus, a current between drain and source through one transistor may continue between drain and source of the other transistor in the stacked connection. In other words, if the transistors are of same type, the transistors may be connected with drain of one transistor in the stacked connection connected to source of the other transistor in the stacked connection. If the transistors are of opposite type, the transistors may be connected with source of one transistor connected with source of the other transistor in the stacked connection.

Further, the transistors being arranged in stacked connection between two terminals (e.g., first transistor and second transistor are arranged in stacked connection between a terminal connected to ground and a terminal connected to supply voltage) implies that drain or source of one transistor is connected to one of the two terminals and drain or source of the other transistor is connected to the other of the two terminals.

As used herein, the term "connected" should be construed as comprising directly connected, such that no components are arranged between the terminals/devices that are connected.

According to an embodiment, the first transistor, the second transistor and the regulating transistor are n-type metal-oxide-semiconductor (nMOS) transistors, and wherein a drain terminal of the first transistor is connected to a source terminal of the second transistor and a drain terminal of the second transistor is connected to a source terminal of the regulating transistor, and wherein the output node is connected to the drain terminal of the first transistor and the source terminal of the second transistor.

It should however be realized that the first transistor may be a pMOS transistor instead in combination with the second transistor and the regulating transistor being nMOS transistors. In such case, a source terminal of the first transistor may be connected to the source terminal of the second transistor and the output node may be connected to the source terminal of the first transistor.

The drain terminal of the second transistor may thus be connected to the source terminal of the regulating transistor. Further, the source terminal of the second transistor is connected to the output node, which is further connected to the bulk terminal of the regulating transistor. This implies that the drain-to-source voltage of the second transistor ($V_{DS2}$) is equal to a negative of the bulk-to-source voltage of the regulating transistor ($V_{BS3}$), i.e., $V_{DS2}=-V_{BS3}$. Thus, any fluctuation in parameters, such as change in temperature or supply voltage, causing $V_{DS2}$ to change will result in the change being sensed by the bulk-to-source voltage of the regulating transistor $V_{BS3}$ and being directly fed back to change $V_{DS2}$ in an opposite direction. Thus, the drain current of the second transistor will change to bring the reference voltage at the output node back to an original value. Hence, a stable reference voltage level is maintained.

According to an embodiment, the gate terminal of the regulating transistor is connected to the source terminal of the regulating transistor.

This implies that a gate-to-source voltage of the regulating transistor $V_{GS3}$ is zero (as the gate and source terminals are connected). Hence, drain current of the regulating transistor may be controlled only by bulk-to-source voltage of the regulating transistor $V_{BS3}$.

This implies that feedback of the reference voltage to the bulk terminal of the regulating transistor may control the drain current of the regulating transistor and ensure that the stable reference voltage level is maintained.

According to an embodiment, the gate terminal of the second transistor is connected to the source terminal of the second transistor.

This implies that a gate-to-source voltage of the second transistor $V_{GS2}$ is zero (as the gate and source terminals are connected). Hence, drain current of the second transistor may be controlled only by bulk-to-source voltage of the second transistor $V_{BS2}$.

The bulk terminal of the second transistor may be connected to ground. This implies that the bulk-to-source voltage of the second transistor $V_{BS2}$ is negative, since the source terminal is connected to the output node. In particular, the bulk-to-source voltage of the second transistor $V_{BS2}$ is a negative of the reference voltage.

The second transistor may be configured to operate in saturation at a subthreshold region. If a drain-to-source voltage of the second transistor $V_{DS2}$ is larger than $4*V_T$ (where $V_T$ is thermal voltage), drain current of the second transistor is controlled only by the negative bulk-to-source voltage of the second transistor $V_{BS2}$. This implies that an extremely low drain current of the second transistor is generated. Hence, the voltage reference circuit may consume ultra-low power.

Further, since the gate-to-source voltage of the second transistor $V_{GS2}$ is zero and the bulk-to-source voltage of the second transistor $V_{BS2}$ is also constant (thanks to the bulk-to-source voltage being the negative of the reference voltage, which is maintained constant), the drain current of the second transistor is constant if the drain-to-source voltage is constant. With the drain-to-source voltage of the second transistor $V_{DS2}$ being equal to a negative of the bulk-to-source voltage of the regulating transistor $V_{BS3}$, the feedback from the regulating transistor may be used for maintaining the drain-to-source voltage of the second transistor $V_{DS2}$ constant and ensuring that a constant drain current of the second transistor is provided.

According to an embodiment, the output node is connected to the gate terminal of the second transistor.

When the gate terminal of the second transistor is connected to the source terminal of the second transistor and the source terminal of the second transistor is also connected to the output node, it follows that the output node is connected to the gate terminal of the second transistor.

According to an embodiment, the gate terminal of the first transistor is connected to ground.

The gate and source terminals of the first transistor may further be connected and the drain and bulk terminals of the first transistor may also be connected and connected to the output node. This implies that the reference voltage at the output node corresponds to a bulk-to-source voltage of the first transistor $V_{BS1}$.

According to another embodiment, the bulk terminal of the first transistor is connected to ground.

The bulk and source terminals of the first transistor may further be connected and the drain and gate terminals of the first transistor may also be connected and connected to the output node. This implies that the reference voltage at the output node corresponds to a gate-to-source voltage of the first transistor $V_{GS1}$.

With all parameters (size, etc.) of the transistors being equal, the voltage reference circuit having the gate terminal of the first transistor connected to ground may provide a higher reference voltage compared to the voltage reference circuit having the bulk terminal of the first transistor connected to ground. Hence, a connection of the first transistor may be selected in design of the voltage reference circuit depending on a desired reference voltage level to be output.

According to an embodiment, the first transistor, the second transistor and the regulating transistor are input/output transistors.

An integrated circuit may comprise input/output transistors and core transistors. Core transistors may have a relatively thin gate oxide layer and are typically used for high speed operations which may be used internally in the integrated circuit. In comparison to core transistors, input/output transistors may have a relatively thick gate oxide layer and are typically used for communication with external devices and, hence, the transistors may be referred to as input/output transistors. Thus, the first transistor, the second transistor and the regulating transistor being input/output transistors should be construed as the transistors being a particular type of transistor within an integrated circuit rather than the transistors necessarily being arranged to communicate with any external device.

The input/output transistors have a low gate leakage current. This implies that the gate leakage current may be negligible compared to drain current of the transistors. The first transistor, the second transistor and the regulating transistor may further be connected such that an equal drain current is provided through all the transistors. This implies that the current through the transistors may be accurately controlled for ensuring that a stable reference voltage is maintained.

Further, using input/output transistors for the second transistor and the regulating transistor compared to using native transistors implies that an improved temperature insensitivity is provided. Native transistors sharing the same substrate imply that parasitic p-n junction diodes are formed between the substrate and the source terminals of the native transistors. At high temperatures, significant reverse-biased leakage current may occur which may affect the output reference voltage. However, using input/output transistors with separate bulk terminals such leakage current may be avoided.

According to an embodiment, an aspect ratio of the regulating transistor equals an aspect ratio of the second transistor.

This may imply that the circuit is easy to manufacture as the transistors may be identical.

Further, the behavior of the second transistor and the regulating transistor may be identical based on having the same aspect ratios. With equal drain currents flowing through the transistors, voltage levels may be easily controlled when the aspect ratio is equal.

The aspect ratio may be defined as a width of a channel of the transistor divided by a length of the channel.

According to a second aspect, there is provided a power management unit comprising the voltage reference circuit according to any one of the preceding claims, the power management unit being configured to produce a direct current, DC, voltage based on the reference voltage.

Effects and features of this second aspect are largely analogous to those described above in connection with the first aspect. Embodiments mentioned in relation to the second aspect are largely compatible with the first aspect.

Power management units typically provide DC voltages and currents for supplying to an electronic circuit. Thanks to the voltage reference circuit providing a stable reference voltage level, the power management unit may also provide reliable supply voltages to electronic circuits connected to the power management unit.

Further, the voltage reference circuit may provide a low power consumption and a compact architecture such that the power management unit may also be compact and provided with low power consumption.

The solutions described in the present description can be applied in numerous electronic circuitry devices and applications.

According to a third aspect, there is provided a neural sensing apparatus comprising the power management unit according to the second aspect.

Effects and features of this third aspect are largely analogous to those described above in connection with the first and second aspects. Embodiments mentioned in relation to the third aspect are largely compatible with the first and second aspects.

For a neural sensing apparatus, such as a neural probe, it is particularly advantageous if the apparatus is small, stable and/or power efficient. Thus, the power management unit utilizing the voltage reference circuit may be particularly advantageous to use in the neural sensing apparatus.

BRIEF DESCRIPTION OF THE DRAWINGS

The above, as well as additional objects, features, and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 2:
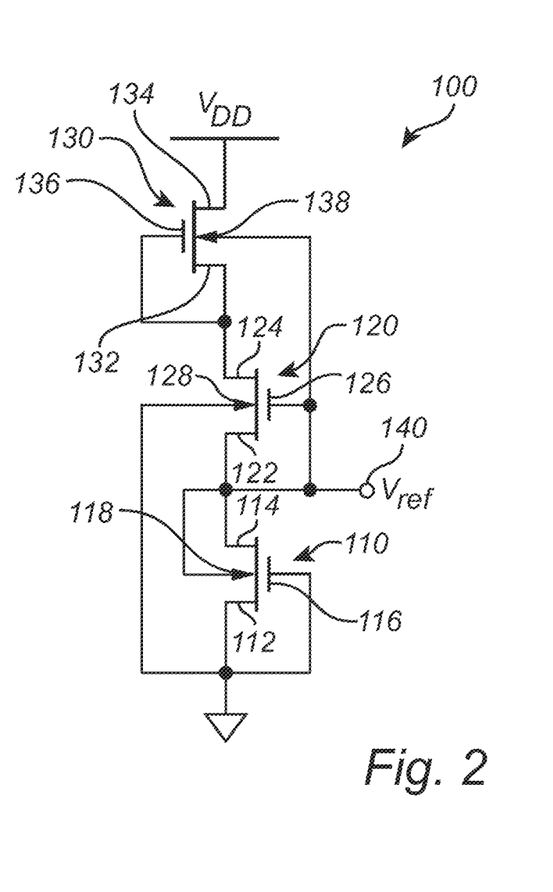
FIG. 2 is a schematic view of a voltage reference circuit according to a first embodiment.

Referring now to FIG. 2, a voltage reference circuit 100 according to a first embodiment will be described. The voltage reference circuit 100 comprises a first transistor 110, a second transistor 120 and a regulating transistor 130.

Each of the first transistor 110, the second transistor 120 and the regulating transistor 130 may be a n-type metal-oxide-semiconductor (nMOS) transistor and the description below is based on the transistors being nMOS transistors. However, it should be realized that the first transistor 110 may instead be a p-type metal-oxide-semiconductor (pMOS) transistor. In such case, source and drain terminals of the transistor should switch places with each other.

Each of the first transistor 110, the second transistor 120 and the regulating transistor 130 may comprise four terminals, a source terminal 112, 122, 132, a drain terminal 114, 124, 134, a gate terminal 116, 126, 136, and a bulk terminal 118, 128, 138. Voltage levels on the gate terminal and the bulk terminal control drain current of the transistors 110, 120, 130.

The first transistor 110 and the second transistor 120 are arranged in a stacked connection with the drain terminal 114 of the first transistor 110 connected to the source terminal 122 of the second transistor 120. The source terminal 112 of the first transistor 110 may further be connected to ground and the drain terminal 124 of the second transistor 120 may be connected to a supply voltage (via the regulating transistor 130).

The second transistor 120 and the regulating transistor 130 are also arranged in a stacked connection with the drain terminal 124 of the second transistor 120 connected to the source terminal 132 of the regulating transistor 130. The source terminal 122 of the second transistor 120 may further be connected to ground (via the first transistor 110) and the drain terminal 134 of the regulating transistor 130 may be connected to the supply voltage.

The first transistor 110 and the second transistor 120 being in a stacked connection and the second transistor 120 and the regulating transistor 130 also being in a stacked connection implies that a current may flow between the supply voltage and ground through all transistors 110, 120, 130.

The first transistor 110, the second transistor 120 and the regulating transistor 130 may be implemented such that a gate leakage current of each transistor is negligible compared with a drain current. This implies that a current drawn from the supply voltage is flowing through all transistors 110, 120, 130 equally, the current corresponding to the drain currents of the transistors 110, 120, 130.

According to an embodiment, the first transistor 110, the second transistor 120 and the regulating transistor 130 may be implemented with thick gate oxide layers in order to ensure that gate leakage current is very low. Such transistors may be referred to as input/output transistors, as transistors used for communication with external devices often are implemented with a thick gate oxide layer.

Although input/output transistors may typically have a high threshold voltage, the transistors 110, 120, 130 may have relatively low threshold voltages. The second transistor 120 and the regulating transistor 130 may have lower threshold voltages than the first transistor 110.

The voltage reference circuit 100 is configured to output a reference voltage $V_{ref}$ at an output node 140 between the first transistor 110 and the second transistor 120. Since the first transistor 110 is arranged in a stacked connection with the second transistor 120, the drain terminal 114 of the first transistor 110 and the source terminal 122 of the second transistor 120 may be connected to the output node 140.

The output node 140 is further connected to the bulk terminal 138 of the regulating transistor 130 for feedback of the reference voltage to the regulating transistor 130. The regulating transistor 130 is configured to provide a compensation for changes in the reference voltage such that the voltage reference circuit 100 maintains a stable reference voltage level.

The second transistor 120 may be configured to generate current in the voltage reference circuit 100. The gate terminal 126 and the source terminal 122 of the second transistor 120 are connected to each other, which also implies that the gate terminal 126 is connected to the output node 140. Since the gate terminal 126 and the source terminal 122 are connected, the second transistor 120 has a zero gate-to-source voltage $V_{GS2}$. The bulk terminal 128 of the second transistor 120 may be connected to ground.

The second transistor 120 may be configured to operate in saturation at a subthreshold region of the second transistor 120. If a drain-to-source voltage $V_{DS2}$ of the second transistor 120 is larger than $4*V_T$ (where $V_T$ is thermal voltage), drain current of the second transistor 120 is controlled only by the bulk-to-source voltage $V_{BS2}$ of the second transistor 120. Since the bulk terminal 128 of the second transistor 120 is connected to ground, the bulk-to-source voltage $V_{BS2}$ of the second transistor 120 is negative. Further, the source terminal 122 of the second transistor 120 is connected to the output node 140 providing the reference voltage $V_{ref}$, such that $V_{BS2}=-V_{ref}$.

The zero gate-to-source voltage $V_{GS2}$ and the negative bulk-to-source voltage $V_{BS2}$ implies that an extremely low drain current $I_{D2}$ may be generated by the second transistor 120. The generated current is supplied to the first transistor 110 and the regulating transistor 130.

Since the gate-to-source voltage $V_{GS2}$ of the second transistor 120 is always zero and the bulk-to-source voltage $V_{BS2}$ is constant (as the output reference voltage $V_{ref}$ is constant in the voltage reference circuit 100 and $V_{BS2}=-V_{ref}$), the drain current $I_{D2}$ will be constant if drain-to-source voltage $V_{DS2}$ of the second transistor 120 is constant.

As will be shown below, the regulating transistor 130 ensures that the drain-to-source voltage $V_{DS2}$ of the second transistor 120 is maintained constant.

As discussed above, the drain current of the regulating transistor 130 equals the drain current of the second transistor 120. The gate terminal 136 of the regulating transistor 130 may be connected to the source terminal 132 of the regulating transistor 130. This implies that the gate-to-source voltage $V_{GS3}$ of the regulating transistor 130 is zero. Hence, the drain current through the regulating transistor 130 is controlled by the bulk-to-source voltage $V_{BS3}$.

An aspect ratio of the regulating transistor 130 may equal an aspect ratio of the second transistor 120. This implies that, with the regulating transistor 130 and the second transistor 120 conducting the same current, the bulk-to-source voltage $V_{BS3}$ of the regulating transistor 130 equals the bulk-to-source voltage $V_{BS2}$ of the second transistor 120, i.e., $V_{BS3}=V_{BS2}=-V_{ref}$. Hence, using the same aspect ratio for the regulating transistor 130 and the second transistor 120 provides an accurate control of the reference voltage.

The bulk terminal 138 of the regulating transistor 130 is connected to the output node 140 and, hence, also connected to the source terminal 122 of the second transistor 120. The source terminal 132 of the regulating transistor 130 is connected to the drain terminal 124 of the second transistor 120. This implies that the drain-to-source voltage $V_{DS2}$ of the second transistor 120 is regulated by the condition $V_{DS2} = -V_{BS3} = V_{ref}$.

Thanks to the regulating transistor 130, a stable reference voltage level may be maintained. If a parameter, such as supply voltage or temperature, fluctuates so that the reference voltage level increases, an incremental change will be sensed by the change in the bulk-to-source voltage $V_{BS3}$ of the regulating transistor 130. The regulating transistor 130 will thus reduce the drain-to-source voltage $V_{DS2}$ of the second transistor 120 such that the drain current of the second transistor 120 will degenerate and bring the reference voltage back to original value. If the reference voltage level instead decreases, the voltage reference circuit 100 operates vice versa to maintain the stable reference voltage level.

According to the embodiment in FIG. 2, the bulk terminal 118 and the drain terminal 114 of the first transistor 110 are connected to each other and connected to the output node 140. Further, the gate terminal 116 and the source terminal 112 of the first transistor 110 are connected to each other and further connected to ground. This implies that the bulk-to-source voltage $V_{BS1}$ of the first transistor corresponds to the reference voltage $V_{ref}$ (bulk connected to reference voltage and source connected to ground).

Figure 3:
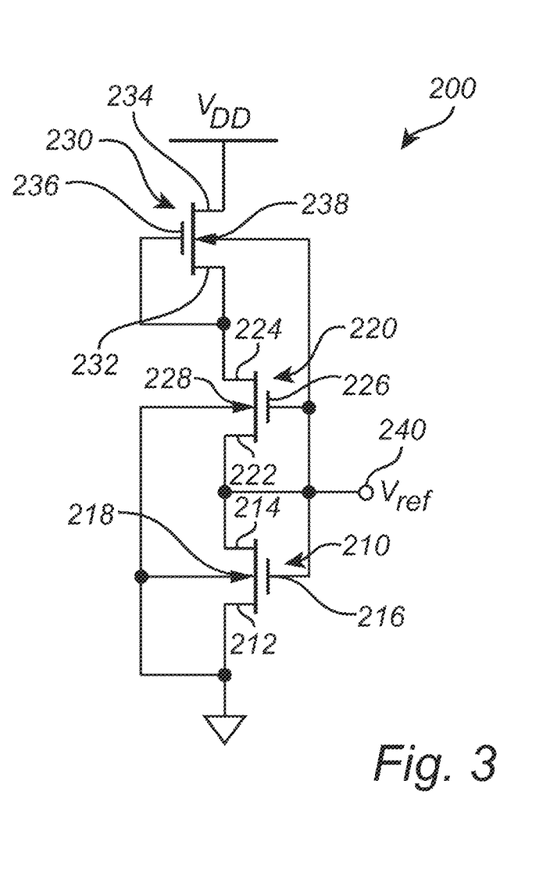
FIG. 3 is a schematic view of a voltage reference circuit according to a second embodiment.

Referring now to FIG. 3, a voltage reference circuit 200 according to a second embodiment will be described.

The voltage reference circuit 200 comprises a first transistor 210, a second transistor 220 and a regulating transistor 230 corresponding to the voltage reference circuit 100 described above with reference to FIG. 2. The drain terminal 224, the source terminal 222, the gate terminal 226 and the bulk terminal 228 of the second transistor 220 are connected in the same manner as described above for the first embodiment. Similarly, the drain terminal 234, the source terminal 232, the gate terminal 236 and the bulk terminal 238 of the regulating transistor 230 are connected in the same manner as described above for the first embodiment. Thus, regulation of the reference voltage may be provided in a same manner as described above.

According to the embodiment in FIG. 3, the gate terminal 216 and the drain terminal 214 of the first transistor 210 are connected to each other and connected to the output node 240. Further, the bulk terminal 218 and the source terminal 212 of the first transistor 210 are connected to each other and further connected to ground. This implies that the gate-to-source voltage $V_{GS1}$ of the first transistor corresponds to the reference voltage $V_{ref}$ (gate connected to reference voltage and source connected to ground).

The connection of the first transistor 110, 210 to the output node 140, 240 and ground affects the reference voltage level at the output node 140, 240. This implies that, if the same transistors are used, a higher reference voltage level may be provided in the configuration of FIG. 2 compared to the configuration of FIG. 3.

The voltage reference circuits 100, 200 have been simulated to analyze the insensitivity of the voltage reference circuits 100, 200 to parameter variations.

In the simulations, corresponding transistors in the circuits 100, 200 have identical properties. Thus, the first transistor 110 of the voltage reference circuit 100 is identical to the first transistor 210 of the voltage reference circuit 200, the second transistor 120 and the regulating transistor 130 of the voltage reference circuit 100 is identical to the second transistor 220 and the regulating transistor 230 of the voltage reference circuit 200. The simulations have been based on the following parameters of the transistors:

The circuits are simulated in 22 nm FDSOI technology.

The first transistors 110, 210 are transistors with low threshold voltage ($V_{th} \sim 0.5V$) and having a channel width of 0.2 μm and a channel length of 0.5 μm.

The second transistors 120, 220 and the regulating transistors 130, 230 are transistors with ultra-low threshold voltage ($V_{th} \sim 0.4V$) and having a channel width of 0.5 μm and a channel length of 0.2 μm.

Figure 4:
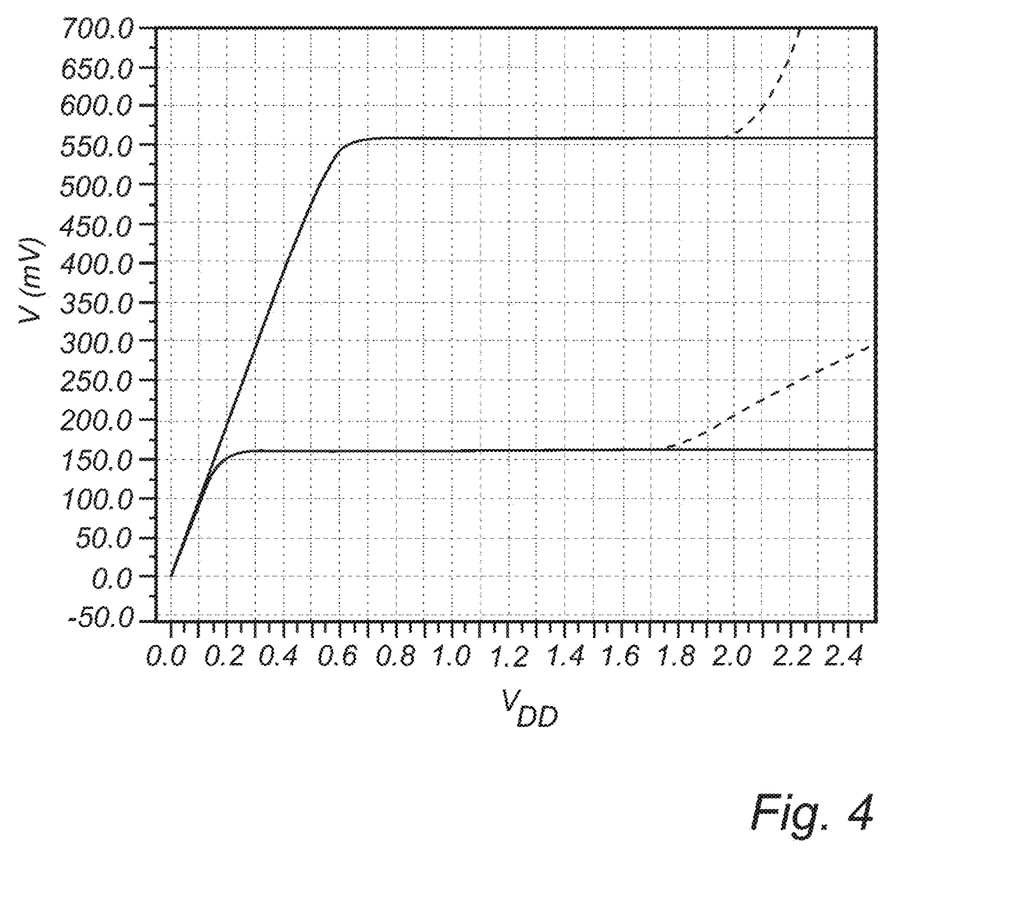
FIG. 4 is a graph illustrating a reference voltage output by the voltage reference circuits of FIG. 2 and FIG. 3, respectively, in dependence of variation of supply voltage.

Referring now to FIG. 4, an operating range of the supply voltage for the voltage reference circuits 100, 200 is illustrated. For the voltage reference circuit 200, the reference voltage assumes a value of approximately 162 mV when the supply voltage reaches approximately 0.35 V. Then, the reference voltage remains constant until the supply voltage reaches approximately 2.5 V, defining an operating range of the supply voltage between 0.35-2.5 V for which the voltage reference circuit 200 provides a constant reference voltage. Similarly, the voltage reference circuit 100 provides a constant reference voltage of approximately 560 mV in an operating range of the supply voltage of 0.8-2.5 V.

Thus, the voltage reference circuits 100, 200 provide a large operating range of the supply voltage. In addition, the voltage reference circuits 100, 200 provide a good line regulation (LR) (change in output reference voltage in dependence of change in supply voltage).

Figure 5:
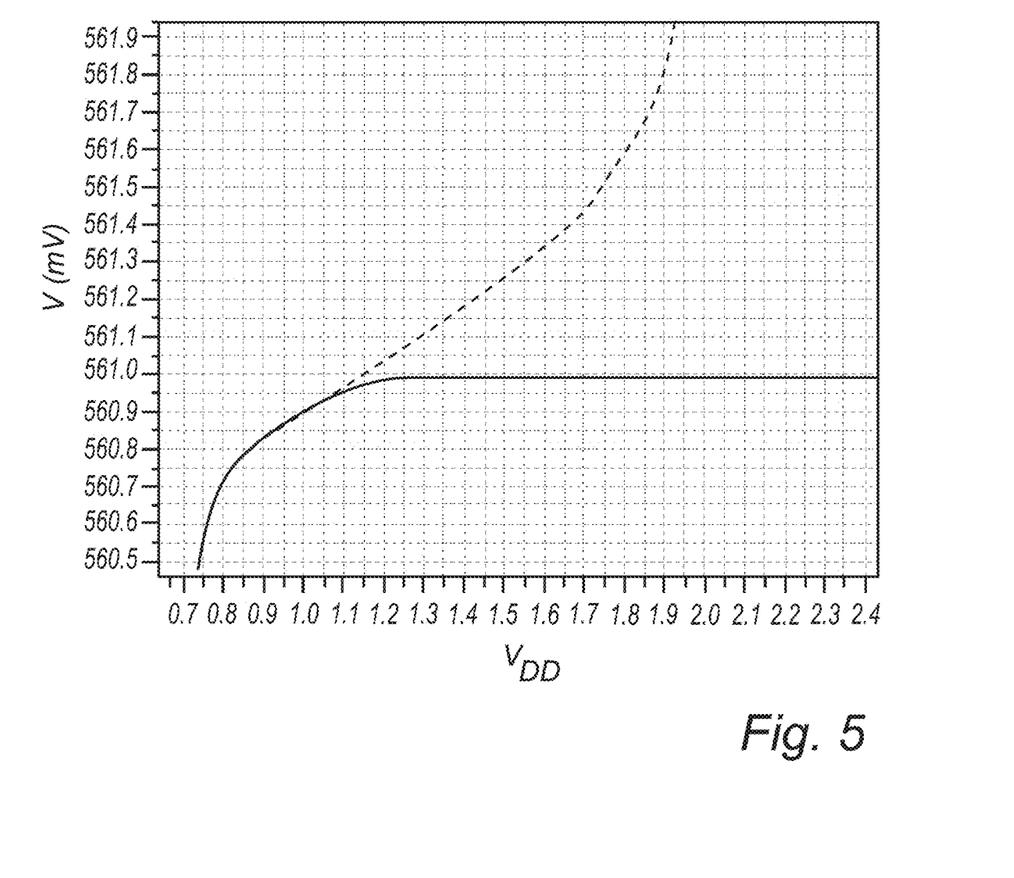
FIG. 5 is an enlargement of a portion of the graph in FIG. 4, illustrating a reference voltage output by the voltage reference circuit of FIG. 2 in dependence of variation of supply voltage.

Referring now to FIG. 5, an enlargement of the graph of FIG. 4 for the voltage reference circuit 100 is shown. Here, the output reference voltage as a function of supply voltage is shown for the voltage reference circuit 100 (solid line) and also for a voltage reference circuit where the regulating transistor 130 has been removed (dashed line). The LR for the circuit without the regulating transistor 130 is 991 μV/V in the range of 0.5 V-1.5 V of the supply voltage. The LR for the voltage reference circuit 100 including the regulating transistor 130 is 161 μV/V, indicating impact of the regulating transistor 130 on performance of the voltage reference circuit 100.

Figure 6:
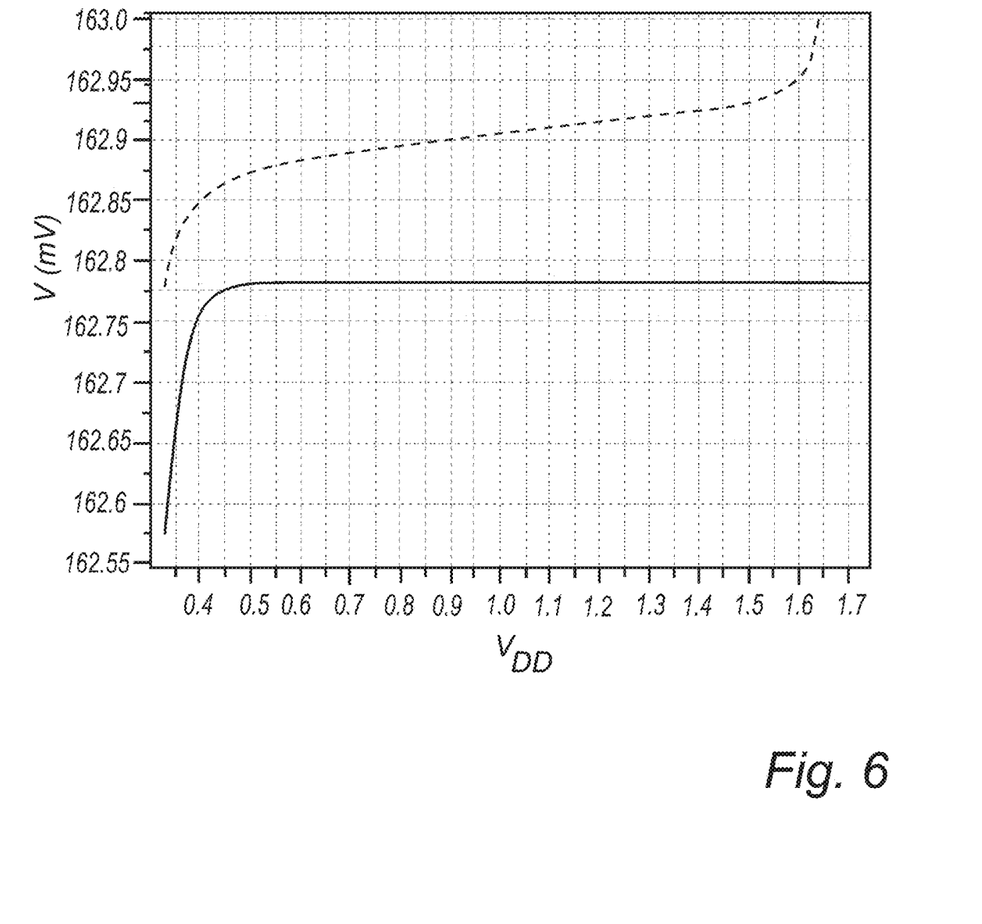
FIG. 6 is an enlargement of a portion of the graph in FIG. 4, illustrating a reference voltage output by the voltage reference circuit of FIG. 3 in dependence of variation of supply voltage.

Referring now to FIG. 6, an enlargement of the graph of FIG. 4 for the voltage reference circuit 200 is shown. Again, the output reference voltage as a function of supply voltage is shown for the voltage reference circuit 200 (solid line) and also for a voltage reference circuit where the regulating transistor 230 has been removed (dashed line). The LR for the circuit without the regulating transistor 230 is 774 μV/V in the range of 1.2 V-1.7 V of the supply voltage. The LR for the voltage reference circuit 200 including the regulating transistor 230 is 100 μV/V, indicating impact of the regulating transistor 230 on performance of the voltage reference circuit 200.

Figure 7:
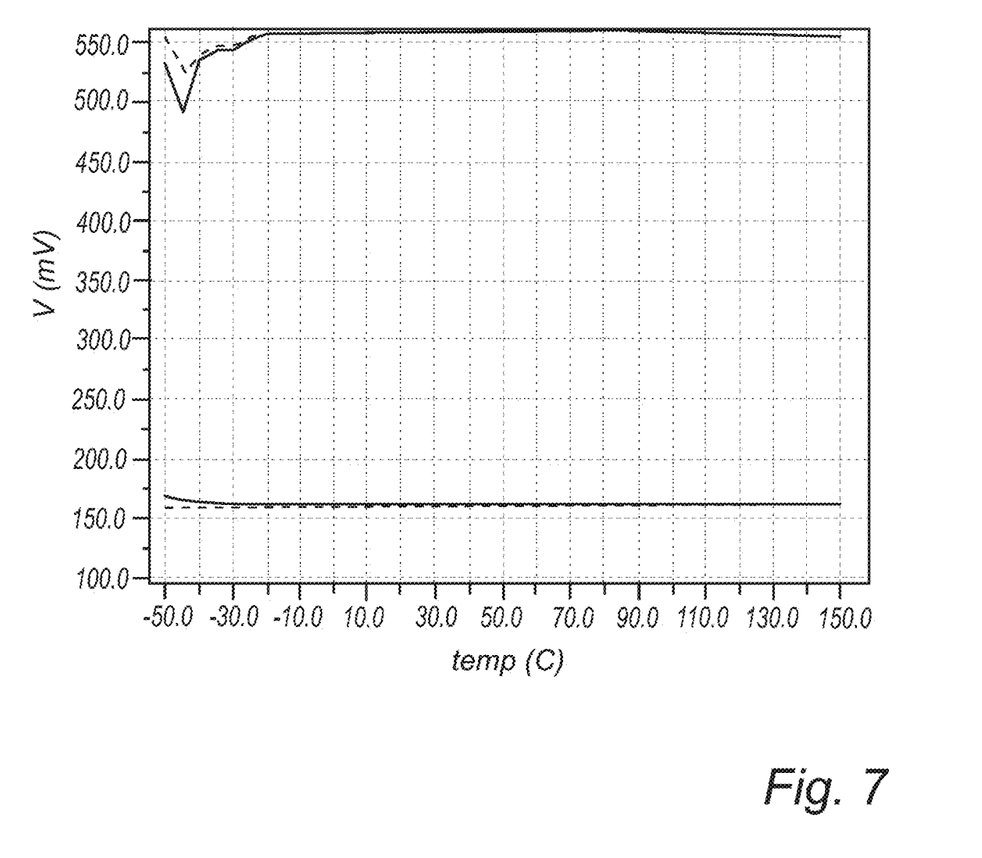
FIG. 7 is a graph illustrating a reference voltage output by the voltage reference circuits of FIG. 2 and FIG. 3, respectively, in dependence of variation of temperature.

Referring now to FIG. 7, temperature characteristics of the reference voltage output by the voltage reference circuits 100, 200 (solid lines) is illustrated as well as temperature characteristics of corresponding circuits without the regulating transistor 130, 230. As is shown in FIG. 7, the reference voltage output by the voltage reference circuits 100, 200 is stable between −10° C. to 150° C. The regulating transistor 130, 230 negligibly affects the temperature insensitivity of the voltage reference circuits 100, 200 in this range. Within this range, a temperature coefficient (TC) of the reference voltages is 198 ppm for the voltage reference circuit 100 and 24.3 ppm for the voltage reference circuit 200. The regulating transistor 130, 230 starts to affect performance of the voltage reference circuits 100, 200 at temperatures below −10° C.

Figure 8:
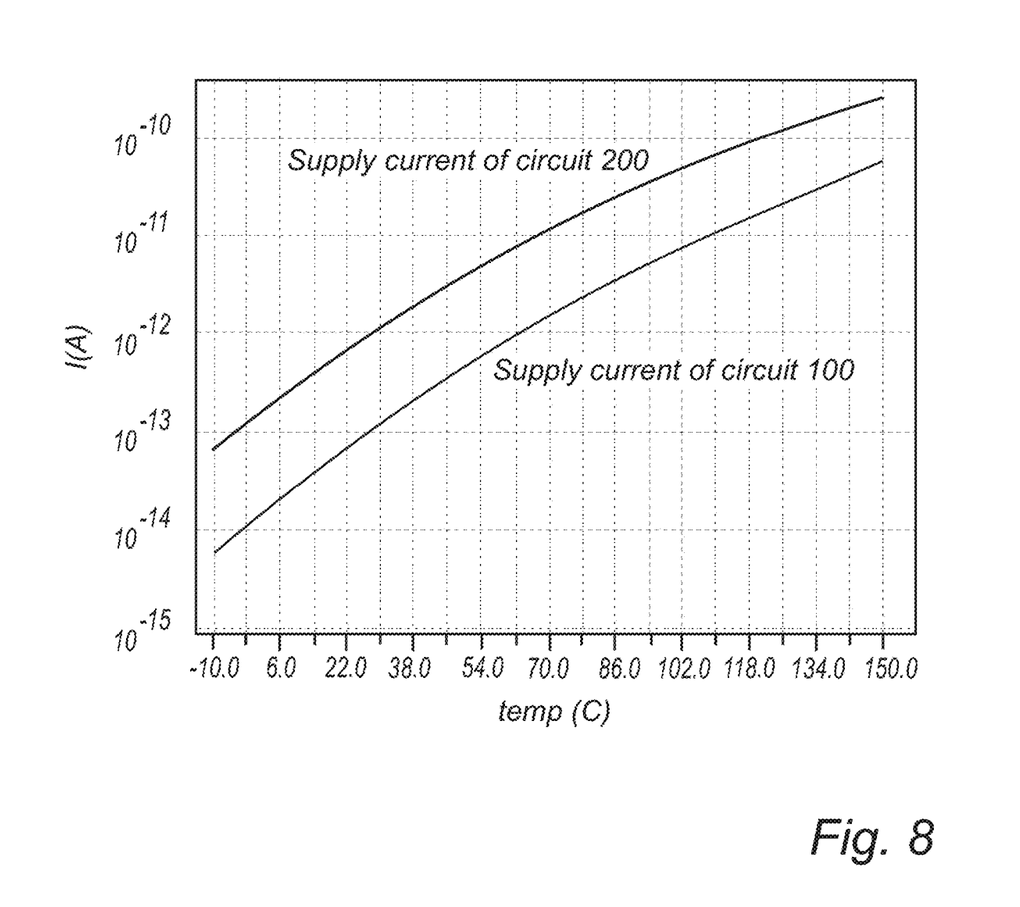
FIG. 8 is a graph illustrating a current consumed by the voltage reference circuits of FIG. 2 and FIG. 3, respectively, in dependence of variation in temperature.

Referring now to FIG. 8, current consumption of the voltage reference circuits 100, 200 is illustrated as a function of temperature, while keeping a supply voltage constant at 1 V. As can be seen, currents consumed by the voltage reference circuits 100, 200 increases almost exponentially over the temperature. The voltage reference circuit 200 consumes approximately ten times higher current than the voltage reference circuit 100 for the entire temperature range. At 30° C., the voltage reference circuit 100 consumes 0.0126 pA and the voltage reference circuit 200 consumes 0.127 pA. Hence, the voltage reference circuits 100, 200 have ultra-low power consumption.

Figure 9:
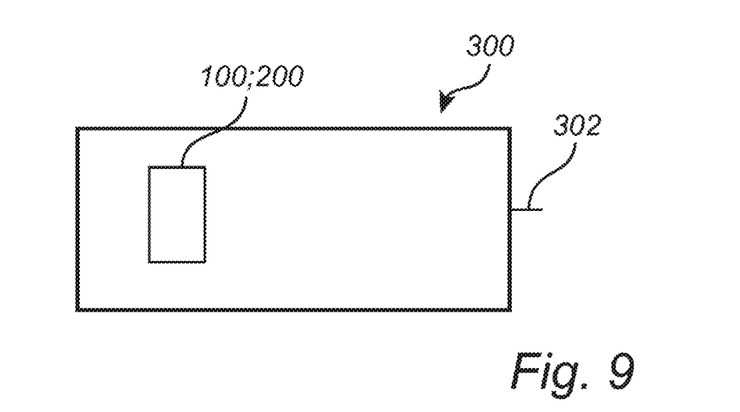
FIG. 9 is a schematic view of a power management unit according to an embodiment.

It should be realized that the voltage reference circuits 100, 200 may be used in any type of circuit or device where a stable voltage reference is desired. For instance, as shown in FIG. 9, a power management unit 300 may comprise any of the voltage reference circuits 100, 200 described above.

The power management unit 300 may be configured to control power functions of modules in electronic devices. Thus, the power management unit 300 may control whether modules are active or in sleep mode and may control power to modules.

The power management unit 300 may be configured to provide a DC voltage to modules of an electronic device, such as to integrated circuits. Thus, the power management unit 300 may need to ensure that a stable voltage level of the DC voltage is provided. In this regard, the power management unit 300 may be configured to produce the DC voltage based on the reference voltage output by the voltage reference circuit 100, 200.

The power management unit 300 may comprise an output interface 302 for communicating with modules of the electronic device. The power management unit 300 may thus send signals for controlling functionality of the modules and may also supply a DC voltage to the modules over the output interface 302.

Since the power management unit 300 controls whether modules are active or in a sleep mode, the power management unit 300 may be maintained active when turning off the electronic device in which the power management unit 300 is arranged. Thus, power consumption of the power management unit 300 is important, in particular, if the power management unit 300 is arranged in a battery-powered device which may be awake only for a fraction of time, which may be the case for IoT-devices.

The voltage reference circuit 100, 200 consumes very small power, as discussed above. Hence, the voltage reference circuits 100, 200 are suited for being used in the power management unit 300.

Figure 10:
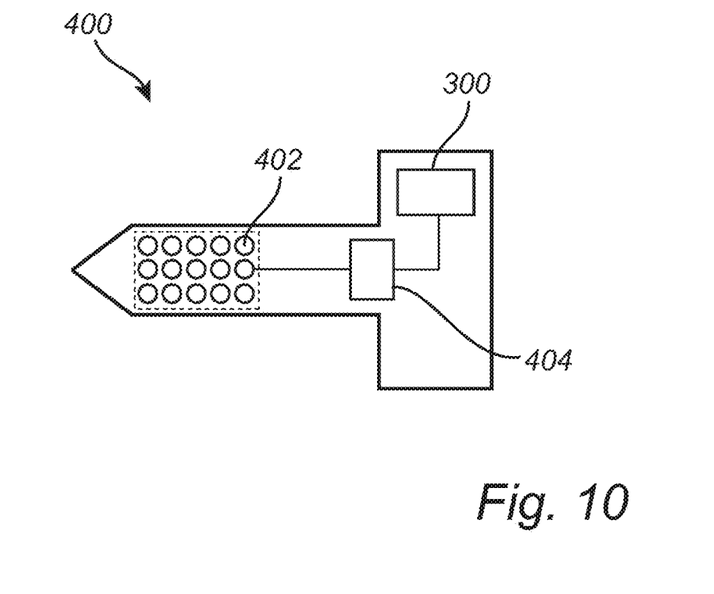
FIG. 10 is a schematic view of a neural sensing apparatus according to an embodiment.

Referring now to FIG. 10, a neural sensing apparatus 400 according to an embodiment will be described.

The neural sensing apparatus 400 may be in form of a neural probe which may be at least partly inserted into a brain. The neural sensing apparatus 400 may comprise electrodes 402 for neural sensing and readout circuitry 404 for reading out signals from the electrodes 402.

The neural sensing apparatus 400 may comprise the power management unit 300 for power management of the neural sensing apparatus 400. The power management unit 300 may be configured to control whether modules, such as the readout circuitry 404, of the neural sensing apparatus 400 are active or in a sleep mode.

The power management unit 300 may further comprise any of the voltage reference circuits 100, 200. The power consumption of the power management unit 300 of the neural sensing apparatus 400 may be very low thanks to the power management unit 300 which utilizes a voltage reference circuit 100, 200 which consumes very small power, as discussed above.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A voltage reference circuit comprising:
a first transistor comprising a gate terminal, a source terminal, a drain terminal and a bulk terminal;
a second transistor comprising a gate terminal, a source terminal, a drain terminal and a bulk terminal, wherein the first transistor and the second transistor are arranged in a stacked connection between a terminal connected to ground and a terminal connected to a supply voltage, wherein a reference voltage is output at an output node between the first transistor and the second transistor; and
a regulating transistor comprising a gate terminal, a source terminal, a drain terminal and a bulk terminal, wherein the regulating transistor is connected between the supply voltage and the first transistor in a stacked connection with the second transistor, wherein the bulk terminal of the regulating transistor is connected to the output node for compensating changes in the reference voltage at the output node to maintain a stable reference voltage level,
wherein the gate terminal of the regulating transistor is connected to the source terminal of the regulating transistor.

2. The voltage reference circuit according to claim 1, wherein the first transistor, the second transistor and the regulating transistor are n-type metal-oxide-semiconductor, nMOS, transistors, and wherein a drain terminal of the first transistor is connected to a source terminal of the second transistor and a drain terminal of the second transistor is connected to a source terminal of the regulating transistor, and wherein the output node is connected to the drain terminal of the first transistor and the source terminal of the second transistor.

3. The voltage reference circuit according to claim 1, wherein the gate terminal of the second transistor is connected to the source terminal of the second transistor.

4. The voltage reference circuit according to claim 1, wherein the output node is connected to the gate terminal of the second transistor.

5. The voltage reference circuit according to claim 1, wherein the gate terminal of the first transistor is connected to ground.

6. The voltage reference circuit according to claim 1, wherein the bulk terminal of the first transistor is connected to ground.

7. The voltage reference circuit according to claim 1, wherein the first transistor, the second transistor and the regulating transistor are input/output transistors.

8. The voltage reference circuit according to claim 1, wherein an aspect ratio of the regulating transistor equals an aspect ratio of the second transistor.

9. A power management unit comprising the voltage reference circuit according to claim 1, the power management unit being configured to produce a direct current, DC, voltage based on the reference voltage.

10. A neural sensing apparatus comprising the power management unit according to claim 9.

11. A voltage reference circuit comprising:
a first transistor comprising a gate terminal, a source terminal, a drain terminal and a bulk terminal;

a second transistor comprising a gate terminal, a source terminal, a drain terminal and a bulk terminal, wherein the first transistor and the second transistor are arranged in a stacked connection between a terminal connected to ground and a terminal connected to a supply voltage, wherein a reference voltage is output at an output node between the first transistor and the second transistor; and a regulating transistor comprising a gate terminal, a source terminal, a drain terminal and a bulk terminal, wherein the regulating transistor is connected between the supply voltage and the first transistor in a stacked connection with the second transistor, wherein the bulk terminal of the regulating transistor is connected to the output node for compensating changes in the reference voltage at the output node to maintain a stable reference voltage level, wherein the gate terminal of the second transistor is connected to the source terminal of the second transistor.

12. A voltage reference circuit comprising:

a first transistor comprising a gate terminal, a source terminal, a drain terminal and a bulk terminal;

a second transistor comprising a gate terminal, a source terminal, a drain terminal and a bulk terminal, wherein the first transistor and the second transistor are arranged in a stacked connection between a terminal connected to ground and a terminal connected to a supply voltage, wherein a reference voltage is output at an output node between the first transistor and the second transistor; and a regulating transistor comprising a gate terminal, a source terminal, a drain terminal and a bulk terminal, wherein the regulating transistor is connected between the supply voltage and the first transistor in a stacked connection with the second transistor, wherein the bulk terminal of the regulating transistor is connected to the output node for compensating changes in the reference voltage at the output node to maintain a stable reference voltage level, wherein the output node is connected to the gate terminal of the second transistor.

\* \* \* \* \*